United States Patent [19] — Keenan et al.

[11] 4,030,942
[45] June 21, 1977

[54] SEMICONDUCTOR MASKING FOR DEVICE FABRICATION UTILIZING ION IMPLANTATION AND OTHER METHODS

[75] Inventors: William Andrew Keenan, Montpelier; Charles Thomas Kroll, Essex Center, both of Vt.

[73] Assignee: International Business Machines Corporation, Armonk, N.Y.

[22] Filed: Oct. 28, 1975

[21] Appl. No.: 626,141

[52] U.S. Cl. .................................. 148/1.5; 148/187; 357/91
[51] Int. Cl.$^2$ ...................................... H01H 21/265
[58] Field of Search ........................... 148/1.5, 187

[56] References Cited
UNITED STATES PATENTS

| | | | |
|---|---|---|---|
| 3,600,218 | 8/1971 | Pennebaker | 148/186 UX |
| 3,756,861 | 9/1973 | Payne et al. | 148/1.5 |

OTHER PUBLICATIONS

Cuomo et al., "Mask Substrate Surface Shield," IBM Tech. Discl. Bull., vol. 15, No. 6, Nov. 1972, pp. 1728, 1729.
Weast, Ed., "Handbook of Chem. & Phys.," Chem. Rubber Co., Cleveland, O., 51st Ed., 1970–1971, p. B64.

Primary Examiner—L. Dewayne Rutledge
Assistant Examiner—J. M. Davis
Attorney, Agent, or Firm—Howard J. Walter, Jr.

[57] ABSTRACT

The disclosure teaches the use of aluminum nitride as a mask for utilization of ion implantation in the formation of semiconductor configurations as well as an underlying material for use in semiconductor lift-off techniques in device formation and the deposition of metallization contact lines and interconnections.

16 Claims, 12 Drawing Figures

SEMICONDUCTOR MASKING FOR DEVICE FABRICATION UTILIZING ION IMPLANTATION AND OTHER METHODS

BACKGROUND OF THE INVENTION

Field of the Invention

Ion implantation is currently taking a significant place in the process used for the manufacture of semiconductor devices. It is a powerful tool for introduction of significant useful impurities into semiconductor bodies as well as being utilized for other purposes such as surface tailoring for resistivity and threshold voltage control and improvement and for various other purposes well known to those skilled in the art.

Notwithstanding the advantages of the ion implantation technique a masking procedure is still required in order to produce various device configurations. Likewise, where several layers of material or metallization is desired in selective areas of the device it is often more convenient to deposit the material over the complete area a material which can be dissolved and lift-off portions of the material not desired in particular areas. Therefore, the invention pertains to that area of technology wherein semiconductor device manufacture utilizes ion implantation and the associated masking procedures and to the lift-off practices long used and well known to those skilled in the art of semiconductor device manufacture.

The use of a thin layer of material, usually 100–500 A silicon dioxide, as a screen for ion implantation is well known. The purpose of this screen material is two fold: (1) to randomize the direction of the ions incident on the silicon surface, thereby minimizing the chance of these ions penetrating deep in the material by channeling along easy open crystal directions, and (2) to prevent contamination of the silicon surface with sputtered impurities. The use of silicon dioxide as a screen material for ion implantation is very convenient and compatible with device processing. However, in the process of implanting through a silicon dioxide screen, oxygen is driven from the silicon dioxide layer into the silicon substrate by the implanted ions. This phenomena is referred to in the literature as the "knock-on" effect. Oxygen in the substrate is known to contribute to device degradation through introductions and nucleation of stacking faults.

It is generally well known that photoresist is an attractive material for use in masking an area for ion implantation. It is convenient to use; once deposited, developed, and etched the mask is complete and no further processing is required. The edges of the mask opening are sharp and well defined and undesired ions are removed when the photoresist mask is stripped. The popularity of photoresist as an ion implantation mask has been impeded since the photoresist which is usually a complex organic compound or mixture thereof, is susceptible to cross linking during ion implantation and forms substances difficult to remove from, for example, a semiconductor substrate. Removal of this material is usually accomplished by oxidation using nascent oxygen, strong acids, or other oxidizing reagents. Organic solvents are ineffective in removing cross linked photoresist.

Furthermore, during the process of ion implantation using a photoresist mask, hydrocarbons are sputtered into the mask opening and react with the silicon or silicon dioxide to form such substances as silicon carbide thereby in the case of field effect transistor manufacture causing a degradation of the gate oxide and other associated problems.

SUMMARY OF THE INVENTION

It is an object of this invention to teach and provide an ion implant mask material and a method of depositing same upon a semiconductor substrate.

It is another object of this invention to provide a masking material useful in semiconductor device manufacture which is completely and rapidly etchable in wafer.

It is another object of this invention to provide a material suitable for deposition upon a semiconductor substrate and capable of acting as an ion implantation mask as well as a material for use lift-off techniques utilized in semiconductor device fabrication.

It is still a further object of this invention to provide a material for suitable deposition upon a semiconductor substrate and capable of acting as a screen for ion implantations, wherein the constituents of such a screen will not degrade the semiconductor substrate.

These and other objects will be more readily understood and apparent from the detailed description of the preferred embodiment hereinafter set forth in connection with the drawings forming a part of this application.

In general the aforesaid objects are accomplished by the utilization of an aluminum nitride layer as an implantation mask or a screen mask. The deposition is accomplished by reacting aluminum chloride and ammonia to produce the aluminum nitride and ammonium cloride which goes off as a gas or any other suitable deposition technique. Aluminum nitride is usable either alone or in conjunction with a photoresist to prevent the aforesaid disadvantages as well as being used as a screen or complete mask for the implantation of a dopant impurity into a semiconductor substrate.

It has been observed where ion implantation is used in the fabrication of field effect transistors or bipolar devices that oxygen atoms in the $SiO_2$ screen oxide are driven into the silicon semiconductor substrate producing detrimental effects and leakage problems. Oxygen has been found to degrade junction leakage probability by nucleating stacking faults in the silicon substrate.

These detrimental effects can be eliminated in accordance with this invention by using aluminum nitride as a screen mask over, for example, the channel or source-drain region in an FET device instead of silicon dioxide. Usually from 160 to 200 Angstrom thick layer will accomplish this improvement.

Aluminum is a trivalent element from column III of the periodic table and nitrogen a pentavalent element from the Group V column of said table and as a result of their electronic configuration both can assume substitution sites in, for example, the silicon lattice. Hence they will not introduce or nucleate stacking faults.

It has been further observed that when the screen oxide is to remain in after ion implantation, as for example in the case of a surface tailoring implant through the gate oxide of an FET device, that this oxide is contaminated by hydrocarbons from the vacuum pump oil, by sputtered hydrocarbons if a photoresist mask is employed and by sputtered metallic impurities from the sample chamber of the ion implanter. This contamination results in degradations of the gate dielectric and are avoided by the use of a thin layer of aluminum nitride over the gate material during ion implantation. After implantation the removal of the nitride removes the contaminants.

DESCRIPTION OF PREFERRED EMBODIMENT

Firstly, it is well known as taught in, for example, any of the Chemistry and Physics handbooks and the critical tables that aluminum nitride is extremely unstable in water especially boiling water.

Figure 1A:
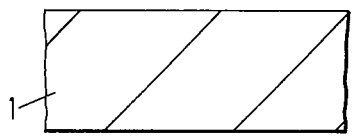
FIGS. 1A through 1F are a series of sectional steps showing aluminum nitride as a photoresist lift-off sublayer.
Figure 2A:
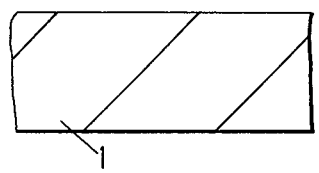
FIGS. 2A through 2F are a series of cross sections illustrating the use of aluminum nitride as a screen for ion implantation in a specific area of the substrate.
Figure 1B:
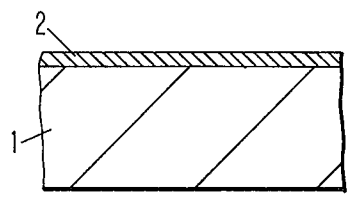
Figure 2B:
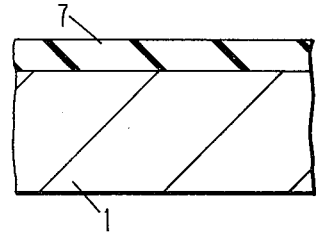

Referring now to the drawings, FIGS. 1A–1F which serve to illustrate the use of aluminum nitride as an ion implant screen, FIG. 1A shows a body 1 of monocrystalline semiconductor silicon, FIG. 1B shows said body of silicon having superimposed upon the surface thereof a layer of aluminum nitride 2 deposited by chemical vapor deposition using any suitable apparatus having hydrogen ambient therein by flowing hydrogen through the deposition chamber at a flow of approximately 90 liters per minute and an $NH_3$ gas flow at about 130cc per minute while at least stoichiometric quantities of aluminum chloride is fed into the system by entrainment in hydrogen gas at a total gas flow of 130cc per minute. The aluminum chloride is maintained at a temperature of between 130° C and 140° C and all feed lines maintained at about 150° C to prevent condensing of aluminum chloride in said lines. The temperature of the substrate in the reaction chamber or section is maintained at 850° C. Under these conditions aluminum nitride is deposited on the substrate at about 180 A per minute.

Figure 1C:
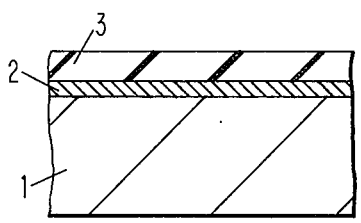
Figure 2C:
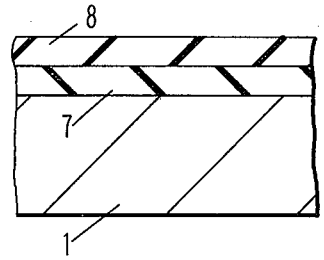
Figure 1D:
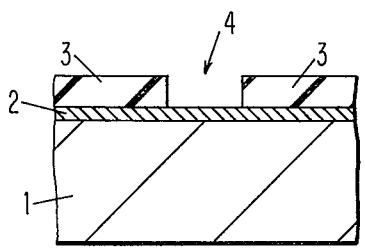
Figure 2D:
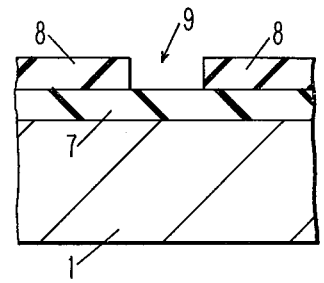
Figure 1E:
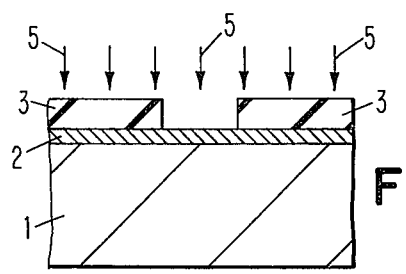
Figure 2E:
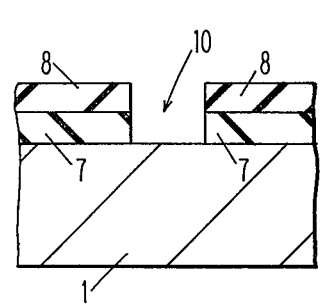
Figure 1F:
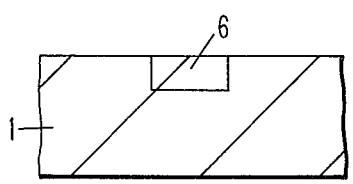
Figure 2F:
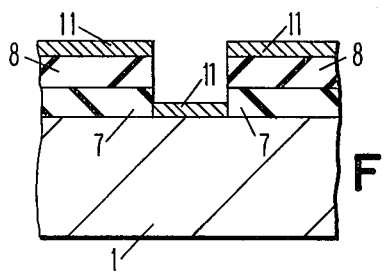

FIG. 1C shows the silicon substrate now containing the aluminum nitride layer 2 and a photoresist layer 3 which is deposited by any conventional means using an appropriate mask to produce openings 4 by conventional exposure and development techniques, as shown in FIG. 1D. Ion implantation of any desired ion is now accomplished using commercially readily available apparatus and as indicated by the arrows in FIG. 1E. Dosage, energy, and depth of implant is dependent upon the ion to be implanted the thickness of aluminum nitride and the over all parameters of the device formation. The implanted substrate is placed in water from 10° C to 100° C or steam whereby the aluminum nitride is dissolved away producing a configuration illustrated in FIG. 1F and having an implanted region 6. Although aluminum nitride is readily etchable in water at practically any temperature below 10° C, the etching proceeds so slowly as to make its use somewhat impractical, especially in semiconductor device manufacture. Aluminum nitride in this instance acts as an implant screen to prevent any oxygen from an $SiO_2$ insulation layer (not shown) entering into the substrate area during implantation process as well as an underlying lift-off layer to remove unwanted aluminum nitride and photoresist. The decomposition, or etching rate of aluminum nitride in hot water and its peculiar properties as a beneficial ion implantation screen greatly enhances the manufacture of semiconductor devices without the use of complex chemicals or other more expensive techniques. Aluminum nitride per se is belived to be peculiar in this respect while seemingly no known equivalent compounds act in a comparable manner.

If the insulation layer, not shown in the drawing, usually consists of $SiO_2$ is to serve only as a screen for the implant and then removed and a new insulation layer grown or deposited the $SiO_2$ screen need not be grown at all as illustrated in FIG. 1. Instead the layer of aluminum nitride is deposited as an implant screen alone and an insulation layer subsequently formed thereby eliminating the removal and reformation of, for example, one $SiO_2$ layer.

In the fabrication of junctions or heavily doped regions by ion implantation it is now obvious from the aforesaid that aluminum nitride can be used over a screen oxide already in place or in place of said screen oxide. If the screen oxide is to remain in place, using aluminum nitride will prevent it from being contaminated with sputtered metallic impurities and hydrocarbons from the photoresist compounds. Hydrocarbons have been found to form or promote the formation of undesirable silicon carbide in the $SiO_2$ insulation area as well as the silicon substrate per se.

If the screen oxide is not to remain as part of the device structure, it is not necessary to form same thereby eliminating a process step, and aluminum nitride can serve as the screen which is easily removable by merely dissolving the same in water after it has served its purpose. This also provides the additional advantage that no oxygen is driven into the silicon substrate. Therefore, junction leakage is greatly reduced by elimination of oxygen induced stacking faults.

FIGS. 2A through 2E are a series of sections illustrating how aluminum nitride can serve only as a screen for ion implantation. A silicon substrate 1 is provided upon which a layer of silicon dioxide 7 is formed over which a photoresist or photosensitive layer 8 is deposited using an appropriate mask coupled with exposure and development to form the opening or any configuration 9. The $SiO_2$ layer with the photoresist in place is etched to form the opening 10 onto the silicon substrate 1. At this point in the process the photoresist can be removed or left in place to serve as additional masking material. A layer of aluminum nitride 11 is now formed in a manner previously described or any other suitable means and implantation undertaken to form an impurity doped region in the substrate under 11. The aluminum nitride is easily removed by dissolving in water or steam and the device formation continued in any desired manner.

It should be emphasized here that there is no known other means or methods to use photoresist and the associated lithography to form patterns or open windows and then use the same for ion implantation with a screening material in place and used as a screen on the mask. That is to say, that it is believed that an implantation screen cannot be deposited or grown with photoresist compound in place.

Ion implantation under conditions herein disclosed can proceed in a normal manner with dose and energy no longer a problem. Dose rate or ion current may be as high as desired. The aluminum nitride on the photoresist as shown in FIG. 2 eliminates sputtering of the photoresist and simultaneously serves as an implant screen in the mask window thereby preventing contamination of the silicon with pump oil hydrocarbons, sputtered oxygen from an $SiO_2$ mask layer as well as sputtered metallic impurities resulting from radiation. By removing the aluminum nitride and the photoresist the sputtered impurities and undesired implanted material stopped by the screen are removed leaving a clean device configuration.

While the invention has been particularly shown and described with reference to preferred embodiments thereof, it will be understood by those skilled in the art that various changes in form and details may be made therein without departing from the spirit and scope of the invention.

What is claimed is:

1. In a process of manufacturing semiconductor devices utilizing ion implantation to implant ions into a region of a semiconductor body, the improvement comprising the steps of: depositing aluminum nitride as an implantation screen on the surface of the implantation region; ion implanting said ions through said screen; and thereafter dissolving said aluminum nitride in water.

2. In a process of manufacturing semiconductor devices utilizing ion implantation to implant ions into a region of a semiconductor body the improvement comprising the steps: depositing a film of aluminum nitride over the region to be implanted, said region having surrounding layers of material at least one of which is a photo sensitive material; ion implanting said ions through said film; and removing, subsequent to implantation, said aluminum nitride film by dissolving same in water.

3. In a process of manufacturing semiconductor devices utilizing ion implantation to implant ions into a semiconductor, the improvement comprising the steps of: depositing a layer of aluminum nitride on said semiconductor; superimposing one or more other material layers thereon all of which are to be removed subsequent to implantation; ion implanting said ions; said removing said layers by dissolving said aluminum nitride in water.

4. A process improvement in accordance with claim 1 wherein said water is between 10° C and 100° C.

5. A process improvement in accordance with claim 1 wherein said water is in the form of water vapor.

6. A process improvement in accordance with claim 1 wherein said semiconductor body is silicon.

7. A process improvement in accordance with claim 2 wherein said aluminum nitride screen is between 100 to 200 Angstroms in thickness.

8. A process improvement in accordance with claim 2 wherein said water is in the form of a vapor.

9. A process improvement in accordance with claim 2 wherein said semiconductor body is silicon.

10. A process improvement in accordance with claim 3 wherein said aluminum nitride is used as a mask.

11. A process improvement in accordance with claim 3 wherein said semiconductor body is silicon.

12. A process improvement in accordance with claim 3 wherein one or more superimposed layers are photosensitive material.

13. A process improvement in accordance with claim 3 wherein said water is a vapor.

14. A process improvement in accordance with claim 1 wherein at least one superimposed layer is a photosensitive material.

15. A process improvement in accordance with claim 2 wherein said water is in the form of a liquid.

16. A process improvement in accordance with claim 3 wherein said water is a liquid.

* * * * *